US009661770B2

(12) United States Patent
McCormack et al.

(10) Patent No.: US 9,661,770 B2
(45) Date of Patent: May 23, 2017

(54) GRAPHIC FORMATION VIA MATERIAL ABLATION

(71) Applicant: Microsoft Technology Licensing, LLC, Redmond, WA (US)

(72) Inventors: Mark Thomas McCormack, Livermore, CA (US); Raj N. Master, San Jose, CA (US); Michael Joseph Lane, Bellevue, WA (US); Krishna Darbha, Redmond, WA (US); Ralf Groene, Kirkland, WA (US); James Alec Ishihara, Bellevue, WA (US); Joshua James Fischer, Guangdong (CN)

(73) Assignee: Microsoft Technology Licensing, LLC, Redmond, WA (US)

( * ) Notice: Subject to any disclaimer, the term of this patent is extended or adjusted under 35 U.S.C. 154(b) by 766 days.

(21) Appl. No.: 13/784,746

(22) Filed: Mar. 4, 2013

(65) Prior Publication Data
US 2014/0248506 A1 Sep. 4, 2014
US 2016/0143170 A9 May 19, 2016

Related U.S. Application Data

(63) Continuation of application No. PCT/CN2012/083074, filed on Oct. 17, 2012.

(51) Int. Cl.
*H05K 5/02* (2006.01)
*B05D 3/06* (2006.01)
(Continued)

(52) U.S. Cl.
CPC ............ *H05K 5/0252* (2013.01); *B05D 3/06* (2013.01); *B44C 1/228* (2013.01); *C23C 14/00* (2013.01);
(Continued)

(58) Field of Classification Search
CPC ... C23C 14/0015; C23C 14/046; C23C 14/00; C23C 14/021; C23C 14/024;
(Continued)

(56) References Cited

U.S. PATENT DOCUMENTS 3,879,586 A 4/1975 DuRocher et al.
4,046,975 A 9/1977 Seeger, Jr.
(Continued)

FOREIGN PATENT DOCUMENTS

CN 1123476 5/1996
CN 1603072 4/2005
(Continued)

OTHER PUBLICATIONS

"Corrected Notice of Allowance", U.S. Appl. No. 14/177,018, Mar. 2, 2015, 2 pages.
(Continued)

*Primary Examiner* — Michael E La Villa

(57) ABSTRACT

Techniques for graphic formation via material ablation described. In at least some implementations, a graphic is applied to a surface of an object by ablating layers of the object to form an ablation trench in the shape of the graphic. In at least some embodiments, an object can include a surface layer and multiple sublayers of materials. When an ablation trench is generated in the object, the ablation trench can penetrate a surface layer of the object and into an intermediate layer. In at least some implementations, height variations in an object surface caused by an ablation trench can cause variations in light reflection properties such that a graphic applied via the ablation trench appears at a different color tone than a surrounding surface, even if the ablation trench and the surrounding surface are coated with a same colored coating.

20 Claims, 7 Drawing Sheets

(51) Int. Cl.

| | |
|---|---|
| *C23C 14/00* | (2006.01) |
| *C23C 14/02* | (2006.01) |
| *C23C 14/04* | (2006.01) |
| *C23C 14/14* | (2006.01) |
| *C23C 14/58* | (2006.01) |
| *B44C 1/22* | (2006.01) |
| *G06F 1/18* | (2006.01) |
| *B41M 5/24* | (2006.01) |

(52) U.S. Cl.
CPC ........ *C23C 14/0015* (2013.01); *C23C 14/021* (2013.01); *C23C 14/024* (2013.01); *C23C 14/025* (2013.01); *C23C 14/028* (2013.01); *C23C 14/04* (2013.01); *C23C 14/046* (2013.01); *C23C 14/14* (2013.01); *C23C 14/58* (2013.01); *G06F 1/181* (2013.01); *B41M 5/24* (2013.01); *Y10T 428/12361* (2015.01); *Y10T 428/12389* (2015.01); *Y10T 428/12396* (2015.01); *Y10T 428/12847* (2015.01); *Y10T 428/12854* (2015.01); *Y10T 428/12882* (2015.01); *Y10T 428/12903* (2015.01); *Y10T 428/12944* (2015.01); *Y10T 428/13* (2015.01); *Y10T 428/2495* (2015.01); *Y10T 428/24967* (2015.01); *Y10T 428/24975* (2015.01); *Y10T 428/263* (2015.01); *Y10T 428/264* (2015.01); *Y10T 428/265* (2015.01)

(58) Field of Classification Search
CPC ....... C23C 14/04; C23C 14/025; C23C 14/14; C23C 14/028; C23C 14/58; Y10T 428/12389; Y10T 428/13; Y10T 428/12847; Y10T 428/12854; Y10T 428/12882; Y10T 428/12903; Y10T 428/12944; Y10T 428/12361; Y10T 428/12396; Y10T 428/2495; Y10T 428/24967; Y10T 428/24975; Y10T 428/263; Y10T 428/264; Y10T 428/265
See application file for complete search history.

(56) References Cited

U.S. PATENT DOCUMENTS

| | | | |
|---|---|---|---|
| 4,065,649 A | 12/1977 | Carter et al. | |
| 4,243,861 A | 1/1981 | Strandwitz | |
| 4,261,042 A | 4/1981 | Ishiwatari et al. | |
| 4,302,648 A | 11/1981 | Sado et al. | |
| 4,317,011 A | 2/1982 | Mazurk | |
| 4,317,013 A | 2/1982 | Larson | |
| 4,323,740 A | 4/1982 | Balash | |
| 4,365,130 A | 12/1982 | Christensen | |
| 4,375,018 A | 2/1983 | Petersen | |
| 4,492,829 A | 1/1985 | Rodrique | |
| 4,510,353 A | 4/1985 | Nemitz | |
| 4,527,021 A | 7/1985 | Morikawa et al. | |
| 4,559,426 A | 12/1985 | Van Zeeland et al. | |
| 4,588,187 A | 5/1986 | Dell | |
| 4,607,147 A | 8/1986 | Ono et al. | |
| 4,651,133 A | 3/1987 | Ganesan et al. | |
| 5,021,638 A | 6/1991 | Nopper et al. | |
| 5,138,119 A | 8/1992 | Demeo | |
| 5,220,521 A | 6/1993 | Kikinis | |
| 5,283,559 A | 2/1994 | Kalendra et al. | |
| 5,331,443 A | 7/1994 | Stanisci | |
| 5,363,075 A | 11/1994 | Fanucchi | |
| 5,404,133 A | 4/1995 | Moriike et al. | |
| 5,548,477 A | 8/1996 | Kumar et al. | |
| 5,558,577 A | 9/1996 | Kato | |
| 5,618,232 A | 4/1997 | Martin | |
| 5,681,220 A | 10/1997 | Bertram et al. | |
| 5,745,376 A | 4/1998 | Barker et al. | |
| 5,748,114 A | 5/1998 | Koehn | |
| 5,781,406 A | 7/1998 | Hunte | |
| 5,807,175 A | 9/1998 | Davis et al. | |
| 5,818,361 A | 10/1998 | Acevedo | |
| 5,828,770 A | 10/1998 | Leis et al. | |
| 5,874,697 A | 2/1999 | Selker et al. | |
| 5,926,170 A | 7/1999 | Oba | |
| 5,971,635 A | 10/1999 | Wise | |
| 6,002,389 A | 12/1999 | Kasser | |
| 6,005,209 A | 12/1999 | Burleson et al. | |
| 6,012,714 A | 1/2000 | Worley et al. | |
| 6,040,823 A | 3/2000 | Seffernick et al. | |
| 6,042,075 A | 3/2000 | Burch, Jr. | |
| 6,044,717 A | 4/2000 | Biegelsen et al. | |
| 6,055,705 A | 5/2000 | Komatsu et al. | |
| 6,061,644 A | 5/2000 | Leis | |
| 6,112,797 A | 9/2000 | Colson et al. | |
| 6,147,859 A | 11/2000 | Abboud | |
| 6,160,264 A | 12/2000 | Rebiere | |
| 6,178,443 B1 | 1/2001 | Lin | |
| 6,254,105 B1 | 7/2001 | Rinde et al. | |
| 6,279,060 B1 | 8/2001 | Luke et al. | |
| 6,329,617 B1 | 12/2001 | Burgess | |
| 6,344,791 B1 | 2/2002 | Armstrong | |
| 6,380,497 B1 | 4/2002 | Hashimoto et al. | |
| 6,437,682 B1 | 8/2002 | Vance | |
| 6,468,672 B1 * | 10/2002 | Donovan, III | C25D 5/14 205/169 |
| 6,506,983 B1 | 1/2003 | Babb et al. | |
| 6,511,378 B1 | 1/2003 | Bhatt et al. | |
| 6,532,147 B1 | 3/2003 | Christ, Jr. | |
| 6,543,949 B1 | 4/2003 | Ritchey et al. | |
| 6,565,439 B2 | 5/2003 | Shinohara et al. | |
| 6,585,435 B2 | 7/2003 | Fang | |
| 6,600,121 B1 | 7/2003 | Olodort et al. | |
| 6,603,408 B1 | 8/2003 | Gaba | |
| 6,617,536 B2 | 9/2003 | Kawaguchi | |
| 6,675,865 B1 | 1/2004 | Yoshida | |
| 6,685,369 B2 | 2/2004 | Lien | |
| 6,704,005 B2 | 3/2004 | Kato et al. | |
| 6,704,864 B1 | 3/2004 | Philyaw | |
| 6,721,019 B2 | 4/2004 | Kono et al. | |
| 6,725,318 B1 | 4/2004 | Sherman et al. | |
| 6,774,888 B1 | 8/2004 | Genduso | |
| 6,776,546 B2 | 8/2004 | Kraus et al. | |
| 6,784,869 B1 | 8/2004 | Clark et al. | |
| 6,813,143 B2 | 11/2004 | Makela | |
| 6,819,316 B2 | 11/2004 | Schulz et al. | |
| 6,819,547 B2 | 11/2004 | Minaguchi et al. | |
| 6,856,506 B2 | 2/2005 | Doherty et al. | |
| 6,861,961 B2 | 3/2005 | Sandbach et al. | |
| 6,864,573 B2 | 3/2005 | Robertson et al. | |
| 6,898,315 B2 | 5/2005 | Guha | |
| 6,914,197 B2 | 7/2005 | Doherty et al. | |
| 6,950,950 B2 | 9/2005 | Sawyers et al. | |
| 6,962,454 B1 | 11/2005 | Costello | |
| 6,970,957 B1 | 11/2005 | Oshins et al. | |
| 6,976,799 B2 | 12/2005 | Kim et al. | |
| 7,051,149 B2 | 5/2006 | Wang et al. | |
| 7,083,295 B1 | 8/2006 | Hanna | |
| 7,091,436 B2 | 8/2006 | Serban | |
| 7,106,222 B2 | 9/2006 | Ward et al. | |
| 7,123,292 B1 | 10/2006 | Seeger et al. | |
| 7,194,662 B2 | 3/2007 | Do et al. | |
| 7,213,991 B2 | 5/2007 | Chapman et al. | |
| 7,277,087 B2 | 10/2007 | Hill et al. | |
| 7,365,967 B2 | 4/2008 | Zheng | |
| 7,447,934 B2 | 11/2008 | Dasari et al. | |
| 7,469,386 B2 | 12/2008 | Bear et al. | |
| 7,499,037 B2 | 3/2009 | Lube | |
| 7,502,803 B2 | 3/2009 | Culter et al. | |
| 7,542,052 B2 | 6/2009 | Solomon et al. | |
| 7,558,594 B2 | 7/2009 | Wilson | |
| 7,559,834 B1 | 7/2009 | York | |
| 7,620,244 B1 | 11/2009 | Collier | |
| 7,636,921 B2 | 12/2009 | Louie | |
| 7,639,329 B2 | 12/2009 | Takeda et al. | |
| 7,639,876 B2 | 12/2009 | Clary et al. | |
| 7,656,392 B2 | 2/2010 | Bolender | |
| 7,686,066 B2 | 3/2010 | Hirao | |

(56) References Cited

U.S. PATENT DOCUMENTS

| | | | |
|---|---|---|---|
| 7,733,326 B1 | 6/2010 | Adiseshan |
| 7,773,076 B2 | 8/2010 | Pittel et al. |
| 7,777,972 B1 | 8/2010 | Chen et al. |
| 7,782,342 B2 | 8/2010 | Koh |
| 7,813,715 B2 | 10/2010 | McKillop et al. |
| 7,817,428 B2 | 10/2010 | Greer, Jr. et al. |
| 7,884,807 B2 | 2/2011 | Hovden et al. |
| 7,893,921 B2 | 2/2011 | Sato |
| 7,907,394 B2 | 3/2011 | Richardson et al. |
| D636,397 S | 4/2011 | Green |
| 7,928,964 B2 | 4/2011 | Kolmykov-Zotov et al. |
| 7,932,890 B2 | 4/2011 | Onikiri et al. |
| 7,945,717 B2 | 5/2011 | Rivalsi |
| 7,973,771 B2 | 7/2011 | Geaghan |
| 7,978,281 B2 | 7/2011 | Vergith et al. |
| 8,018,386 B2 | 9/2011 | Qi et al. |
| 8,026,904 B2 | 9/2011 | Westerman |
| 8,053,688 B2 | 11/2011 | Conzola et al. |
| 8,059,384 B2 | 11/2011 | Park et al. |
| 8,065,624 B2 | 11/2011 | Morin et al. |
| 8,069,356 B2 | 11/2011 | Rathi et al. |
| 8,077,160 B2 | 12/2011 | Land et al. |
| 8,120,166 B2 | 2/2012 | Koizumi et al. |
| 8,130,203 B2 | 3/2012 | Westerman |
| 8,154,524 B2 | 4/2012 | Wilson et al. |
| D659,139 S | 5/2012 | Gengler |
| 8,169,421 B2 | 5/2012 | Wright et al. |
| 8,229,509 B2 | 7/2012 | Paek et al. |
| 8,229,522 B2 | 7/2012 | Kim et al. |
| 8,403,576 B2 | 3/2013 | Merz |
| 8,477,100 B2 | 7/2013 | Wang et al. |
| 8,582,280 B2 | 11/2013 | Ryu |
| 8,991,473 B2 | 3/2015 | Bornemann et al. |
| 8,997,983 B2 | 4/2015 | Sajid |
| 9,027,631 B2 | 5/2015 | Bornemann et al. |
| 9,064,654 B2 | 6/2015 | Whitt, III et al. |
| 9,073,123 B2 | 7/2015 | Campbell et al. |
| 9,111,703 B2 | 8/2015 | Whitt, III et al. |
| 9,146,620 B2 | 9/2015 | Whitt et al. |
| 9,432,070 B2 | 8/2016 | Mercer |
| 2002/0134828 A1 | 9/2002 | Sandbach et al. |
| 2002/0195177 A1 | 12/2002 | Hinkley et al. |
| 2003/0160712 A1 | 8/2003 | Levy |
| 2003/0173195 A1 | 9/2003 | Federspiel |
| 2003/0197687 A1 | 10/2003 | Shetter |
| 2004/0258924 A1 | 12/2004 | Berger et al. |
| 2004/0268000 A1 | 12/2004 | Barker et al. |
| 2005/0030728 A1 | 2/2005 | Kawashima et al. |
| 2005/0057515 A1 | 3/2005 | Bathiche |
| 2005/0059489 A1 | 3/2005 | Kim |
| 2005/0146512 A1 | 7/2005 | Hill et al. |
| 2005/0264653 A1 | 12/2005 | Starkweather et al. |
| 2005/0264988 A1 | 12/2005 | Nicolosi |
| 2005/0285703 A1 | 12/2005 | Wheeler et al. |
| 2006/0049993 A1 | 3/2006 | Lin et al. |
| 2006/0061555 A1 | 3/2006 | Mullen |
| 2006/0082973 A1 | 4/2006 | Egbert et al. |
| 2006/0085658 A1 | 4/2006 | Allen et al. |
| 2006/0110537 A1 | 5/2006 | Huang et al. |
| 2006/0125799 A1 | 6/2006 | Hillis et al. |
| 2006/0154725 A1 | 7/2006 | Glaser et al. |
| 2006/0156415 A1 | 7/2006 | Rubinstein et al. |
| 2006/0181514 A1 | 8/2006 | Newman |
| 2006/0195522 A1 | 8/2006 | Miyazaki |
| 2006/0276221 A1 | 12/2006 | Lagnado et al. |
| 2007/0062089 A1 | 3/2007 | Homer et al. |
| 2007/0072474 A1 | 3/2007 | Beasley et al. |
| 2007/0182663 A1 | 8/2007 | Biech |
| 2007/0200830 A1 | 8/2007 | Yamamoto |
| 2007/0234420 A1 | 10/2007 | Novotney et al. |
| 2007/0236408 A1 | 10/2007 | Yamaguchi et al. |
| 2007/0247432 A1 | 10/2007 | Oakley |
| 2007/0252827 A1 | 11/2007 | Hirota |
| 2007/0260892 A1 | 11/2007 | Paul et al. |
| 2007/0283179 A1 | 12/2007 | Burnett et al. |
| 2008/0005423 A1 | 1/2008 | Jacobs et al. |
| 2008/0083127 A1 | 4/2008 | Mcmurtry et al. |
| 2008/0104437 A1 | 5/2008 | Lee |
| 2008/0151478 A1 | 6/2008 | Chern |
| 2008/0158185 A1 | 7/2008 | Westerman |
| 2008/0167832 A1 | 7/2008 | Soss |
| 2008/0238884 A1 | 10/2008 | Harish |
| 2008/0253822 A1 | 10/2008 | Matias |
| 2008/0309636 A1 | 12/2008 | Feng et al. |
| 2008/0316002 A1 | 12/2008 | Brunet et al. |
| 2008/0318008 A1* | 12/2008 | Wielstra ............. B26B 19/38 428/195.1 |
| 2008/0320190 A1 | 12/2008 | Lydon et al. |
| 2009/0009476 A1 | 1/2009 | Daley, III |
| 2009/0044113 A1 | 2/2009 | Jones et al. |
| 2009/0073060 A1 | 3/2009 | Shimasaki et al. |
| 2009/0073957 A1 | 3/2009 | Newland et al. |
| 2009/0079639 A1 | 3/2009 | Hotta et al. |
| 2009/0096756 A1 | 4/2009 | Lube |
| 2009/0127005 A1 | 5/2009 | Zachut et al. |
| 2009/0140985 A1 | 6/2009 | Liu |
| 2009/0163147 A1 | 6/2009 | Steigerwald et al. |
| 2009/0174687 A1 | 7/2009 | Ciesla et al. |
| 2009/0189873 A1 | 7/2009 | Peterson |
| 2009/0251008 A1 | 10/2009 | Sugaya |
| 2009/0262492 A1 | 10/2009 | Whitchurch et al. |
| 2009/0295648 A1 | 12/2009 | Dorsey et al. |
| 2009/0303137 A1 | 12/2009 | Kusaka et al. |
| 2009/0303204 A1 | 12/2009 | Nasiri et al. |
| 2009/0317595 A1* | 12/2009 | Brehm ............. B42D 25/328 428/172 |
| 2009/0320244 A1 | 12/2009 | Lin |
| 2009/0321490 A1 | 12/2009 | Groene et al. |
| 2010/0001963 A1 | 1/2010 | Doray et al. |
| 2010/0026656 A1 | 2/2010 | Hotelling et al. |
| 2010/0038821 A1 | 2/2010 | Jenkins et al. |
| 2010/0045609 A1 | 2/2010 | Do et al. |
| 2010/0045633 A1 | 2/2010 | Gettemy |
| 2010/0051356 A1 | 3/2010 | Stern et al. |
| 2010/0051432 A1 | 3/2010 | Lin et al. |
| 2010/0053534 A1 | 3/2010 | Hsieh et al. |
| 2010/0077237 A1 | 3/2010 | Sawyers |
| 2010/0078328 A1* | 4/2010 | Mandler ............. C25D 9/06 205/50 |
| 2010/0081377 A1 | 4/2010 | Chatterjee et al. |
| 2010/0085321 A1 | 4/2010 | Pundsack |
| 2010/0103112 A1 | 4/2010 | Yoo et al. |
| 2010/0149111 A1 | 6/2010 | Olien |
| 2010/0149134 A1 | 6/2010 | Westerman et al. |
| 2010/0156798 A1 | 6/2010 | Archer |
| 2010/0161522 A1 | 6/2010 | Tirpak et al. |
| 2010/0164857 A1 | 7/2010 | Liu et al. |
| 2010/0171891 A1 | 7/2010 | Kaji et al. |
| 2010/0174421 A1 | 7/2010 | Tsai et al. |
| 2010/0180063 A1 | 7/2010 | Ananny et al. |
| 2010/0188299 A1 | 7/2010 | Rinehart et al. |
| 2010/0206614 A1 | 8/2010 | Park et al. |
| 2010/0206644 A1 | 8/2010 | Yeh |
| 2010/0214257 A1 | 8/2010 | Wussler et al. |
| 2010/0222110 A1 | 9/2010 | Kim et al. |
| 2010/0231556 A1 | 9/2010 | Mines et al. |
| 2010/0238075 A1 | 9/2010 | Pourseyed |
| 2010/0250988 A1 | 9/2010 | Okuda et al. |
| 2010/0274932 A1 | 10/2010 | Kose |
| 2010/0279768 A1 | 11/2010 | Huang et al. |
| 2010/0289457 A1 | 11/2010 | Onnerud et al. |
| 2010/0295812 A1 | 11/2010 | Burns et al. |
| 2010/0302378 A1 | 12/2010 | Marks et al. |
| 2010/0304793 A1 | 12/2010 | Kim |
| 2010/0306538 A1 | 12/2010 | Thomas et al. |
| 2010/0308778 A1 | 12/2010 | Yamazaki et al. |
| 2010/0308844 A1 | 12/2010 | Day et al. |
| 2010/0315348 A1 | 12/2010 | Jellicoe et al. |
| 2010/0325155 A1 | 12/2010 | Skinner et al. |
| 2010/0331059 A1 | 12/2010 | Apgar et al. |
| 2011/0012873 A1 | 1/2011 | Prest et al. |
| 2011/0019123 A1 | 1/2011 | Prest et al. |
| 2011/0031287 A1 | 2/2011 | Le Gette et al. |
| 2011/0037721 A1 | 2/2011 | Cranfill et al. |

(56) References Cited

U.S. PATENT DOCUMENTS

| | | |
|---|---|---|
| 2011/0043990 A1 | 2/2011 | Mickey et al. |
| 2011/0045317 A1* | 2/2011 | Hao .................. C23C 18/30 428/669 |
| 2011/0048754 A1* | 3/2011 | Xiong .................. C23C 26/00 174/50 |
| 2011/0060926 A1 | 3/2011 | Brooks et al. |
| 2011/0069148 A1 | 3/2011 | Jones et al. |
| 2011/0074688 A1 | 3/2011 | Hull et al. |
| 2011/0102326 A1 | 5/2011 | Casparian et al. |
| 2011/0102356 A1 | 5/2011 | Kemppinen et al. |
| 2011/0134032 A1 | 6/2011 | Chiu et al. |
| 2011/0157087 A1 | 6/2011 | Kanehira et al. |
| 2011/0163955 A1 | 7/2011 | Nasiri et al. |
| 2011/0164370 A1 | 7/2011 | McClure et al. |
| 2011/0167181 A1 | 7/2011 | Minoo et al. |
| 2011/0167287 A1 | 7/2011 | Walsh et al. |
| 2011/0167391 A1 | 7/2011 | Momeyer et al. |
| 2011/0167992 A1 | 7/2011 | Eventoff et al. |
| 2011/0179864 A1 | 7/2011 | Raasch et al. |
| 2011/0184646 A1 | 7/2011 | Wong et al. |
| 2011/0193787 A1 | 8/2011 | Morishige et al. |
| 2011/0205372 A1 | 8/2011 | Miramontes |
| 2011/0227913 A1 | 9/2011 | Hyndman |
| 2011/0242138 A1 | 10/2011 | Tribble |
| 2011/0248920 A1 | 10/2011 | Larsen |
| 2011/0261001 A1 | 10/2011 | Liu |
| 2011/0266672 A1 | 11/2011 | Sylvester |
| 2011/0290686 A1 | 12/2011 | Huang |
| 2011/0291958 A1 | 12/2011 | Wu et al. |
| 2011/0297566 A1 | 12/2011 | Gallagher et al. |
| 2011/0304577 A1 | 12/2011 | Brown |
| 2011/0305875 A1 | 12/2011 | Sanford et al. |
| 2011/0316807 A1 | 12/2011 | Corrion |
| 2012/0007821 A1 | 1/2012 | Zaliva |
| 2012/0011462 A1 | 1/2012 | Westerman et al. |
| 2012/0013490 A1 | 1/2012 | Pance |
| 2012/0013519 A1 | 1/2012 | Hakansson et al. |
| 2012/0023459 A1 | 1/2012 | Westerman |
| 2012/0024682 A1 | 2/2012 | Huang et al. |
| 2012/0026048 A1 | 2/2012 | Vazquez et al. |
| 2012/0032887 A1 | 2/2012 | Chiu et al. |
| 2012/0044179 A1 | 2/2012 | Hudson |
| 2012/0047368 A1 | 2/2012 | Chinn et al. |
| 2012/0050975 A1 | 3/2012 | Garelli et al. |
| 2012/0075249 A1 | 3/2012 | Hoch |
| 2012/0081316 A1 | 4/2012 | Sirpal et al. |
| 2012/0092279 A1 | 4/2012 | Martin |
| 2012/0094257 A1 | 4/2012 | Pillischer et al. |
| 2012/0099749 A1 | 4/2012 | Rubin et al. |
| 2012/0103778 A1 | 5/2012 | Obata et al. |
| 2012/0115553 A1 | 5/2012 | Mahe et al. |
| 2012/0117409 A1 | 5/2012 | Lee et al. |
| 2012/0127118 A1 | 5/2012 | Nolting et al. |
| 2012/0140396 A1 | 6/2012 | Zeliff et al. |
| 2012/0145525 A1 | 6/2012 | Ishikawa |
| 2012/0146863 A1 | 6/2012 | Kwon |
| 2012/0155015 A1 | 6/2012 | Govindasamy et al. |
| 2012/0162693 A1 | 6/2012 | Ito |
| 2012/0182242 A1 | 7/2012 | Lindahl et al. |
| 2012/0194393 A1 | 8/2012 | Uttermann et al. |
| 2012/0194448 A1 | 8/2012 | Rothkopf |
| 2012/0223866 A1 | 9/2012 | Ayala et al. |
| 2012/0224073 A1 | 9/2012 | Miyahara |
| 2012/0227259 A1 | 9/2012 | Badaye et al. |
| 2012/0235635 A1 | 9/2012 | Sato |
| 2012/0246377 A1 | 9/2012 | Bhesania |
| 2012/0256959 A1 | 10/2012 | Ye et al. |
| 2012/0274811 A1 | 11/2012 | Bakin |
| 2012/0298491 A1 | 11/2012 | Ozias et al. |
| 2012/0300275 A1 | 11/2012 | Vilardell et al. |
| 2013/0044059 A1 | 2/2013 | Fu |
| 2013/0063873 A1 | 3/2013 | Wodrich et al. |
| 2013/0076635 A1 | 3/2013 | Lin |
| 2013/0156080 A1 | 6/2013 | Cheng et al. |
| 2013/0227836 A1 | 9/2013 | Whitt, III |
| 2013/0228435 A1 | 9/2013 | Whitt, III |
| 2013/0229356 A1 | 9/2013 | Marwah |
| 2013/0229366 A1 | 9/2013 | Dighde |
| 2013/0229759 A1 | 9/2013 | Whitt, III |
| 2013/0241860 A1 | 9/2013 | Ciesla et al. |
| 2014/0131000 A1 | 5/2014 | Bornemann et al. |
| 2014/0135060 A1 | 5/2014 | Mercer |
| 2014/0148938 A1 | 5/2014 | Zhang |
| 2014/0154523 A1 | 6/2014 | Bornemann |
| 2014/0166227 A1 | 6/2014 | Bornemann |
| 2015/0227212 A1 | 8/2015 | Whitt, III et al. |

FOREIGN PATENT DOCUMENTS

| | | |
|---|---|---|
| CN | 200947406 | 9/2007 |
| CN | 101335147 | 12/2008 |
| CN | 101388482 | 3/2009 |
| DE | 10116556 | 10/2002 |
| EP | 2009660 | 12/2008 |
| EP | 2353978 | 8/2011 |
| EP | 2423787 | 2/2012 |
| GB | 1100331 | 1/1968 |
| GB | 2068643 | 8/1981 |
| JP | 56159134 | 12/1981 |
| JP | H0195596 | 4/1989 |
| JP | 10326124 | 12/1998 |
| JP | 2003257282 | 9/2003 |
| JP | 2005302447 | 10/2005 |
| JP | 2009009854 | 1/2009 |
| JP | 2010272384 | 12/2010 |
| KR | 20060003093 | 1/2006 |
| WO | WO 2011049609 | 4/2011 |

OTHER PUBLICATIONS

"Non-Final Office Action", U.S. Appl. No. 13/599,635, Feb. 12, 2015, 16 pages.

"Non-Final Office Action", U.S. Appl. No. 13/653,218, Mar. 4, 2015, 16 pages.

"Notice of Allowance", U.S. Appl. No. 13/595,700, Jan. 21, 2015, 4 pages.

"Notice of Allowance", U.S. Appl. No. 13/599,763, Feb. 18, 2015, 4 pages.

"Notice of Allowance", U.S. Appl. No. 13/653,184, Mar. 10, 2015, 6 pages.

"Notice of Allowance", U.S. Appl. No. 13/715,229, Jan. 9, 2015, 6 pages.

"Accessing Device Sensors", retrieved from <https://developer.palm.com/content/api/dev-guide/pdk/accessing-device-sensors.html> on May 25, 2012, 4 pages.

"ACPI Docking for Windows Operating Systems", Retrieved from: <http://www.scritube.com/limba/engleza/software/ACPI-Docking-for-Windows-Opera331824193.php> on Jul. 6, 2012, 10 pages.

"Cholesteric Liquid Crystal", Retrieved from: <http://en.wikipedia.org/wiki/Cholesteric_liquid_crystal> on Aug. 6, 2012,(Jun. 10, 2012), 2 pages.

"Cirago Slim Case®—Protective case with built-in kickstand for your iPhone 5®", Retrieved from <http://cirago.com/wordpress/wp-content/uploads/2012/10/ipc1500brochure1.pdf> on Jan. 29, 2013, (Jan. 2013), 1 page.

"DR2PA", retrieved from <http://www.architainment.co.uk/wp-content/uploads/2012/08/DR2PA-AU-US-size-Data-Sheet-Rev-H_LOGO.pdf> on Sep. 17, 2012, 4 pages.

"First One Handed Fabric Keyboard with Bluetooth Wireless Technology", Retrieved from: <http://press.xtvworld.com/article3817.html> on May 8, 2012,(Jan. 6, 2005), 2 pages.

"Force and Position Sensing Resistors: An Emerging Technology", *Interlink Electronics*, Available at <http://staff.science.uva.nl/~vlaander/docu/FSR/An_Exploring_Technology.pdf>,(Feb. 1990), pp. 1-6.

"Frogpad Introduces Weareable Fabric Keyboard with Bluetooth Technology", Retrieved from: <http://www.geekzone.co.nz/content.asp?contentid=3898> on May 7, 2012,(Jan. 7, 2005), 3 pages.

(56) References Cited

OTHER PUBLICATIONS

"How to Use the iPad's Onscreen Keyboard", Retrieved from <http://www.dummies.com/how-to/content/how-to-use-the-ipads-onscreen-keyboard.html> on Aug. 28, 2012, 3 pages.

"i-Interactor electronic pen", Retrieved from: <http://www.alibaba.com/product-gs/331004878/i_Interactor_electronic_pen.html> on Jun. 19, 2012, 5 pages.

"Incipio LG G-Slate Premium Kickstand Case—Black Nylon", Retrieved from: <http://www.amazon.com/Incipio-G-Slate-Premium-Kickstand-Case/dp/B004ZKP916> on May 8, 2012, 4 pages.

"Membrane Keyboards & Membrane Keypads", Retrieved from: <http://www.pannam.com/> on May 9, 2012,(Mar. 4, 2009), 2 pages.

"Motion Sensors", *Android Developers*, retrieved from <http://developer.android.com/guide/topics/sensors/sensors_motion.html> on May 25, 2012, 7 pages.

"MPC Fly Music Production Controller", *AKAI Professional*, Retrieved from: <http://www.akaiprompc.com/mpc-fly> on Jul. 9, 2012, 4 pages.

"NI Releases New Maschine & Maschine Mikro", Retrieved from <http://www.djbooth.net/index/dj-equipment/entry/ni-releases-new-maschine-mikro/> on Sep. 17, 2012, 19 pages.

"Non-Final Office Action", U.S. Appl. No. 13/471,001, (Feb. 19, 2013), 15 pages.

"Non-Final Office Action", U.S. Appl. No. 13/471,139, (Mar. 21, 2013), 12 pages.

"Non-Final Office Action", U.S. Appl. No. 13/471,202, (Feb. 11, 2013), 10 pages.

"Non-Final Office Action", U.S. Appl. No. 13/471,336, (Jan. 18, 2013), 14 pages.

"Non-Final Office Action", U.S. Appl. No. 13/651,195, (Jan. 2, 2013), 14 pages.

"Non-Final Office Action", U.S. Appl. No. 13/651,232, (Jan. 17, 2013), 15 pages.

"Non-Final Office Action", U.S. Appl. No. 13/651,272, (Feb. 12, 2013), 10 pages.

"Non-Final Office Action", U.S. Appl. No. 13/651,287, (Jan. 29, 2013), 13 pages.

"Non-Final Office Action", U.S. Appl. No. 13/651,304, (Mar. 22, 2013), 9 pages.

"Non-Final Office Action", U.S. Appl. No. 13/651,327, (Mar. 22, 2013), 6 pages.

"Non-Final Office Action", U.S. Appl. No. 13/651,871, (Mar. 18, 2013), 14 pages.

"Non-Final Office Action", U.S. Appl. No. 13/651,976, (Feb. 22, 2013), 16 pages.

"Non-Final Office Action", U.S. Appl. No. 13/653,321, (Feb. 1, 2013), 13 pages.

"Non-Final Office Action", U.S. Appl. No. 13/653,682, (Feb. 7, 2013), 11 pages.

"Non-Final Office Action", U.S. Appl. No. 13/656,520, (Feb. 1, 2013), 15 pages.

"Notice of Allowance", U.S. Appl. No. 13/470,633, (Mar. 22, 2013), 7 pages.

"On-Screen Keyboard for Windows 7, Vista, XP with Touchscreen", Retrieved from <www.comfort-software.com/on-screen-keyboard.html> on Aug. 28, 2012, (Feb. 2, 2011), 3 pages.

"Position Sensors", *Android Developers*, retrieved from <http://developer.android.com/guide/topics/sensors/sensors_position.html> on May 25, 2012, 5 pages.

"Reflex LCD Writing Tablets", retrieved from <http://www.kentdisplays.com/products/lcdwritingtablets.html>on Jun. 27, 2012, 3 pages.

"Restriction Requirement", U.S. Appl. No. 13/471,139, (Jan. 17, 2013), 7 pages.

"Restriction Requirement", U.S. Appl. No. 13/651,304, (Jan. 18, 2013), 7 pages.

"Restriction Requirement", U.S. Appl. No. 13/651,726, (Feb. 22, 2013), 6 pages.

"Restriction Requirement", U.S. Appl. No. 13/651,871, (Feb. 7, 2013), 6 pages.

"SMART Board™ Interactive Display Frame Pencil Pack", Available at <http://downloads01.smarttech.com/media/sitecore/en/support/product/sbfpd/400series(interactivedisplayframes)/guides/smartboardinteractivedisplayframepencilpackv12mar09.pdf>,(2009), 2 pages.

"SolRxTM E-Series Multidirectional Phototherapy ExpandableTM 2-Bulb Full Body Panel System", Retrieved from: <http://www.solarcsystems.com/us_multidirectional_uv_light_therapy_1_intro.html > on Jul. 25, 2012,(2011), 4 pages.

"The Microsoft Surface Tablets Comes With Impressive Design and Specs", Retrieved from <http://microsofttabletreview.com/the-microsoft-surface-tablets-comes-with-impressive-design-and-specs> on Jan. 30, 2013, (Jun. 2012), 2 pages.

"Tilt Shift Lenses: Perspective Control", retrieved from http://www.cambridgeincolour.com/tutorials/tilt-shift-lenses1.htm, (Mar. 28, 2008), 11 Pages.

"Virtualization Getting Started Guide", *Red Hat Enterprise Linux 6, Edition 0.2*, retrieved from <http://docs.redhat.com/docs/en-US/Red_Hat_Enterprise_Linux/6/html-single/Virtualization_Getting_Started_Guide/index.html> on Jun. 13, 2012, 24 pages.

"What is Active Alignment?", http://www.kasalis.com/active_alignment.html, retrieved on Nov. 22, 2012, 2 Pages.

Block, Steve et al., "DeviceOrientation Event Specification", *W3C, Editor's Draft*, retrieved from <https://developer.palm.com/content/api/dev-guide/pdk/accessing-device-sensors.html> on May 25, 2012,(Jul. 12, 2011),14 pages.

Brown, Rich "Microsoft Shows Off Pressure-Sensitive Keyboard", retrieved from <http://news.cnet.com/8301-17938_105-10304792-1.html> on May 7, 2012, (Aug. 6, 2009), 2 pages.

Butler, Alex et al., "SideSight: Multi-"touch" Interaction around Small Devices", *In the proceedings of the 21st annual ACM symposium on User interface software and technology.*, retrieved from <http://research.microsoft.com/pubs/132534/sidesight_crv3.pdf> on May 29, 2012,(Oct. 19, 2008), 4 pages.

Crider, Michael "Sony Slate Concept Tablet "Grows" a Kickstand", Retrieved from: <http://androidcommunity.com/sony-slate-concept-tablet-grows-a-kickstand-20120116/> on May 4, 2012,(Jan. 16, 2012), 9 pages.

Das, Apurba et al., "Study of Heart Transfer through Multilayer Clothing Assemblies: A Theoretical Prediciton", Retrieved from <http://www.autexrj.com/cms/zalaczone_pliki/5_013_11.pdf>, (Jun. 2011),7 pages.

Dietz, Paul H., et al., "A Practical Pressure Sensitive Computer Keyboard", In Proceedings of UIST 2009,(Oct. 2009), 4 pages.

Glatt, Jeff "Channel and Key Pressure (Aftertouch).", Retrieved from: <http://home.roadrunner.com/~jgglatt/tutr/touch.htm> on Jun. 11, 2012, 2 pages.

Hanlon, Mike "ElekTex Smart Fabric Keyboard Goes Wireless", Retrieved from: <http://www.gizmag.com/go/5048/ > on May 7, 2012,(Jan. 15, 2006), 5 pages.

Iwase, Eiji "Multistep Sequential Batch Assembly of Three-Dimensional Ferromagnetic Microstructures with Elastic Hinges", Retrieved at <<http://ieeexplore.ieee.org/stamp/stamp.jsp?tp=&arnumber=1549861>> *Proceedings: Journal of Microelectromechanical Systems*, (Dec. 2005), 7 pages.

Kaur, Sukhmani "Vincent Liew's redesigned laptop satisfies ergonomic needs", Retrieved from: <http://www.designbuzz.com/entry/vincent-liew-s-redesigned-laptop-satisfies-ergonomic-needs/> on Jul. 27, 2012,(Jun. 21, 2010), 4 pages.

Khuntontong, Puttachat et al., "Fabrication of Molded Interconnection Devices by Ultrasonic Hot Embossing on Thin Polymer Films", IEEE Transactions on Electronics Packaging Manufacturing, vol. 32, No. 3,(Jul. 2009), pp. 152-156.

Li, et al., "Characteristic Mode Based Tradeoff Analysis of Antenna-Chassis Interactions For Multiple Antenna Terminals", *In IEEE Transactions on Antennas and Propagation*, Retrieved from <http://ieeexplore.ieee.org/stamp/stamp.jsp?tp=&arnumber=6060882>, (Feb. 2012), 13 pages.

(56) References Cited

OTHER PUBLICATIONS

Linderholm, Owen "Logitech Shows Cloth Keyboard for PDAs", Retrieved from: <http://www.pcworld.com/article/89084/logitech_shows_cloth_keyboard_for_pdas.html> on May 7, 2012,(Mar. 15, 2002), 5 pages.
McLellan, Charles "Eleksen Wireless Fabric Keyboard: A first look", Retrieved from: <http://www.zdnetasia.com/eleksen-wireless-fabric-keyboard-a-first-look-40278954.htm> on May 7, 2012,(Jul. 17, 2006), 9 pages.
Piltch, Avram "ASUS Eee Pad Slider SL101 Review ", Retrieved from <http://www.laptopmag.com/review/tablets/asus-eee-pad-slider-sl101.aspx>, (Sep. 22, 2011), 5 pages.
Post, E.R. et al., "E-Broidery: Design and Fabrication of Textile-Based Computing", IBM Systems Journal, vol. 39, Issue 3 & 4,(Jul. 2000), pp. 840-860.
Purcher, Jack "Apple is Paving the Way for a New 3D GUI for IOS Devices", Retrieved from: <http://www.patentlyapple.com/patently-apple/2012/01/apple-is-paving-the-way-for-a-new-3d-gui-for-ios-devices.html> on Jun. 4, 2012,(Jan. 12, 2012), 15 pages.
Qin, Yongqiang et al., "pPen: Enabling Authenticated Pen and Touch Interaction on Tabletop Surfaces", *In Proceedings of ITS 2010*, Available at <http://www.dfki.de/its2010/papers/pdf/po172.pdf>,(Nov. 2010), pp. 283-284.
Sumimoto, Mark "Touch & Write: Surface Computing With Touch and Pen Input", Retrieved from: <http://www.gottabemobile.com/2009/08/07/touch-write-surface-computing-with-touch-and-pen-input/> on Jun. 19, 2012,(Aug. 7, 2009), 4 pages.
Takamatsu, Seiichi et al., "Flexible Fabric Keyboard with Conductive Polymer-Coated Fibers", In Proceedings of Sensors 2011,(Oct. 28, 2011), 4 pages.
Valliath, G T., "Design of Hologram for Brightness Enhancement in Color LCDs", Retrieved from <http://www.loreti.it/Download/PDF/LCD/44_05.pdf> on Sep. 17, 2012, 5 pages.
Williams, Jim "A Fourth Generation of LCD Backlight Technology", Retrieved from <http://cds.linearcom/docs/Application%20Note/an65f.pdf>, (Nov. 1995),124 pages.
Zhang, et al., "Model-Based Development of Dynamically Adaptive Software", *In Proceedings of ICSE 2006*, Available at <http://www.irisa.fr/lande/lande/icse-proceedings/icse/p371.pdf>,(May 20, 2006), pp. 371-380.
"Corrected Notice of Allowance", U.S. Appl. No. 13/715,229, Apr. 16, 2015, 2 pages.
"Non-Final Office Action", U.S. Appl. No. 13/689,541, May 21, 2015, 20 pages.
"Non-Final Office Action", U.S. Appl. No. 14/160,421, Jun. 19, 2015, 11 pages.
"Notice of Allowance", U.S. Appl. No. 13/471,282, Apr. 30, 2015, 8 pages.
"Supplemental Notice of Allowance", U.S. Appl. No. 13/595,700, Apr. 10, 2015, 2 pages.
"Supplemental Notice of Allowance", U.S. Appl. No. 13/595,700, May 4, 2015, 2 pages.
"Supplemental Notice of Allowance", U.S. Appl. No. 13/595,700, May 22, 2015, 2 pages.
"Supplemental Notice of Allowance", U.S. Appl. No. 13/653,184, Jun. 24, 2015, 2 pages.
"Corrected Notice of Allowance", U.S. Appl. No. 13/715,133, Apr. 2, 2014, 2 pages.
"Non-Final Office Action", U.S. Appl. No. 13/595,700, Jun. 18, 2014, 8 pages.
"Non-Final Office Action", U.S. Appl. No. 13/599,763, May 28, 2014, 6 pages.
"Restriction Requirement", U.S. Appl. No. 13/595,700, May 28, 2014, 6 pages.
"Non-Final Office Action", U.S. Appl. No. 13/656,520, (Jun. 5, 2013), 8 pages.
"PCT Search Report and Written Opinion", Application No. PCT/US2013/028948, (Jun. 21, 2013),11 pages.
"Restriction Requirement", U.S. Appl. No. 13/715,229, (Aug. 13, 2013), 7 pages.
"Final Office Action", U.S. Appl. No. 13/595,700, Aug. 15, 2014, 6 pages.
"Final Office Action", U.S. Appl. No. 13/599,635, Aug. 8, 2014, 16 pages.
"International Search Report and Written Opinion", Application No. PCT/US2013/041017, Jul. 17, 2014, 10 pages.
"International Search Report and Written Opinion", Application No. PCT/US2013/028768, Jun. 24, 2014, 12 pages.
"Non-Final Office Action", U.S. Appl. No. 13/471,282, Sep. 3, 2014, 13 pages.
"Non-Final Office Action", U.S. Appl. No. 13/715,229, Aug. 19, 2014, 9 pages.
"Restriction Requirement", U.S. Appl. No. 13/653,184, Sep. 5, 2014, 6 pages.
"Notice of Allowance", U.S. Appl. No. 13/656,520, (Oct. 2, 2013), 5 pages.
"Restriction Requirement", U.S. Appl. No. 13/715,133, (Oct. 28, 2013), 6 pages.
"Restriction Requirement", U.S. Appl. No. 13/715,133, (Dec. 3, 2013), 6 pages.
"Non-Final Office Action", U.S. Appl. No. 13/599,635, Feb. 25, 2014, 13 pages.
"Corrected Notice of Allowance", U.S. Appl. No. 13/656,520, Jan. 16, 2014, 3 pages.
"Notice of Allowance", U.S. Appl. No. 13/715,133, Jan. 6, 2014, 7 pages.
"Ex Parte Quayle Action", U.S. Appl. No. 13/599,763, Nov. 14, 2014, 6 pages.
"Final Office Action", U.S. Appl. No. 13/595,700, Oct. 9, 2014, 8 pages.
"Non-Final Office Action", U.S. Appl. No. 13/653,184, Dec. 1, 2014, 7 pages.
"Notice of Allowance", U.S. Appl. No. 14/177,018, Nov. 21, 2014, 7 pages.
"Restriction Requirement", U.S. Appl. No. 13/653,218, Nov. 7, 2014, 6 pages.
"Final Office Action", U.S. Appl. No. 13/599,635, Jul. 30, 2015, 23 pages.
"Final Office Action", U.S. Appl. No. 13/653,218, Oct. 5, 2015, 16 pages.
"Final Office Action", U.S. Appl. No. 13/689,541, Nov. 2, 2015, 21 pages.
"Final Office Action", U.S. Appl. No. 14/160,421, Dec. 9, 2015, 12 pages.
"Supplementary Euorpean Search Report", EP Application No. 13728568.0, Oct. 30, 2015, 7 pages.
"Extended European Search Report", EP Application No. 13728568.0, Mar. 14, 2016, 16 pages.
"Foreign Office Action", CN Application No. 201380025290.9, May 10, 2016, 15 pages.
"Foreign Office Action", CN Application No. 201380054090.6, Mar. 28, 2016, 16 Pages.
"Non-Final Office Action", U.S. Appl. No. 13/653,218, Apr. 20, 2016, 17 pages.
"Non-Final Office Action", U.S. Appl. No. 13/689,541, Apr. 14, 2016, 23 pages.
"Notice of Allowance", U.S. Appl. No. 14/160,421, May 26, 2016, 6 pages.
"Corrected Notice of Allowance", U.S. Appl. No. 14/160,421, Jun. 30, 2016, 2 pages.
"Foreign Office Action", CN Application No. 201380025290.9, Oct. 19, 2016, 8 pages.
"Foreign Office Action", CN Application No. 201380054090.6, Oct. 10, 2016, 20 pages.
"Restriction Requirement", U.S. Appl. No. 13/653,218, Oct. 21, 2016, 6 pages.
"Foreign Office Action", CN Application No. 201310067641.4, Jan. 23, 2017, 7 pages.
"Foreign Office Action", CN Application No. 201380025290.9, Mar. 27, 2017, 13 pages.
"Foreign Office Action", CN Application No. 201380054090.6, Jan. 25, 2017, 15 pages.

(56) References Cited

OTHER PUBLICATIONS

"Foreign Office Action", EP Application No. 14720018.2, Mar. 7, 2017, 7 pages.
"Foreign Office Action", JP Application No. 2015-512767, Jan. 24, 2017, 8 pages.
"Non-Final Office Action", U.S. Appl. No. 14/692,497, Feb. 22, 2017, 8 pages.
"Notice of Allowance", U.S. Appl. No. 13/653,218, Mar. 10, 2017, 13 pages.
"Supplemental Notice of Allowance", U.S. Appl. No. 13/653,218, Apr. 7, 2017, 3 pages.

* cited by examiner

GRAPHIC FORMATION VIA MATERIAL ABLATION

RELATED MATTERS

This application claims priority under 35 USC 119(b) to International Application No. PCT/CN2012/083074 filed Oct. 17, 2012, the disclosure of which is incorporated in its entirety.

BACKGROUND

Many products include some form of graphic ornamentation, such as for decoration, to identify a source of a product (e.g., a logo), to indicate functionality associated with a product, and so on. A variety of techniques can be utilized to apply graphics to a product.

For instance, a graphic can be applied via a printed item that is adhered to a surface of a product using a suitable adhesive. One example of such as graphic is a decal. While decals can be convenient to produce and apply, they can often be easily damaged and/or removed.

Various types of coatings (e.g., paint or other liquid coating) can also be utilized to apply graphics. A graphic applied with a coating may also be easily damaged, and thus detract from the appearance of the graphic.

Screen printing is another technique that can be employed to apply a graphic to a product. While screen printing is useful in certain scenarios, it can introduce complexity into a production process that can increase product cost and/or production time for bringing a product to market. Thus, many current techniques for applying graphics suffer from a number of drawbacks.

SUMMARY

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

Techniques for graphic formation via material ablation described. In at least some implementations, specifications are provided (e.g., via user input) for a graphic to be applied to a surface of an object. The graphic, for instance, can be some form of an image, such as a logo, a visual pattern and/or design, a word and/or phrase, artwork, and so on. Further, the object can be configured as an instance of a wide variety of different objects, such as a computing device (e.g., a mobile computing device), a toy, a vehicle, and/or any other object that includes a surface upon which a graphic can be applied. Based on the specifications for the graphic, an ablation trench in the shape of the graphic can be applied to a surface of the object. In at least some implementations, the ablation trench is generated by removing material from the surface of the object in the shape of the graphic, such as via laser ablation.

In at least some embodiments, an object can include a surface layer and one or more sublayers of materials. For instance, the object can be plated with different layers, such as metals, metal alloys, resins, and so forth. When an ablation trench is generated in the object, the ablation trench can penetrate into a surface layer to form a particular graphic. Alternatively or additionally, the ablation trench can penetrate the surface layer of the object and into an intermediate layer. For instance, a lowermost portion (e.g., bottom) of the ablation trench can penetrate into the intermediate layer, without penetrating a lower layer beneath the intermediate layer. In at least some implementations, this can enable a coating that will adhere to the ablation trench (e.g., the material of the intermediate layer) to be applied to the ablation trench and the object surface. The coating, for instance, can be a thin coating that can be applied to the ablation trench and the surrounding surface of the object. The coating can provide various properties to the ablation trench and the surrounding surface, such as color tinting, scratch resistance, fingerprint resistance, and so on.

In at least some implementations, height variations in an object surface caused by an ablation trench can cause variations in light reflection properties such that a graphic applied via the ablation trench appears at a different color tone than a surrounding surface, even if the ablation trench and the surrounding surface are coated with a same coating.

BRIEF DESCRIPTION OF THE DRAWINGS

The detailed description is described with reference to the accompanying figures. In the figures, the left-most digit(s) of a reference number identifies the figure in which the reference number first appears. The use of the same reference numbers in different instances in the description and the figures may indicate similar or identical items. Entities represented in the figures may be indicative of one or more entities and thus reference may be made interchangeably to single or plural forms of the entities in the discussion.

DETAILED DESCRIPTION

Overview

Figure 1:
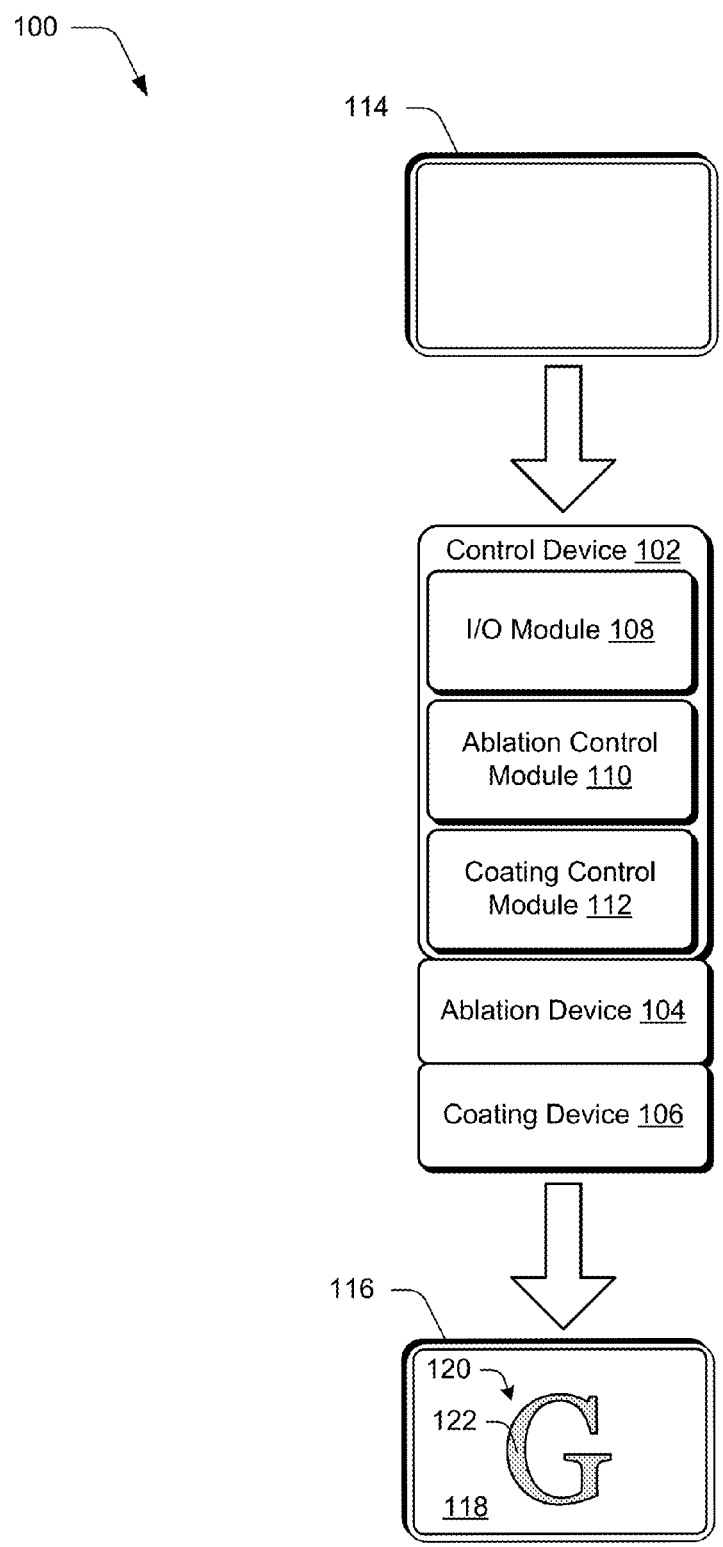
FIG. 1 is an illustration of an environment in an example implementation that is operable to employ the techniques described herein in accordance with one or more embodiments.

Techniques for graphic formation via material ablation described. In at least some implementations, specifications are provided (e.g., via user input) for a graphic to be applied to a surface of an object. The graphic, for instance, can be some form of an image, such as a logo, a visual pattern and/or design, a word and/or phrase, artwork, and so on. Further, the object can be configured as an instance of a wide variety of different objects, such as a computing device (e.g., a mobile computing device), a toy, a vehicle, and/or any other object that includes a surface upon which a graphic can be applied. Based on the specifications for the graphic, an ablation trench in the shape of the graphic can be applied to a surface of the object. In at least some implementations, the ablation trench is generated by removing material from the surface of the object in the shape of the graphic, such as via laser ablation.

In at least some embodiments, an object can include a surface layer and one or more sublayers of materials. For instance, the object can be plated with different layers, such as metals, metal alloys, resins, and so forth. When an ablation trench is generated in the object, the ablation trench can penetrate into a surface layer to form a particular graphic. Alternatively or additionally, the ablation trench can penetrate the surface layer of the object and into an intermediate layer. For instance, a lowermost portion (e.g., bottom) of the ablation trench can penetrate into the intermediate layer, without penetrating a lower layer beneath the intermediate layer. In at least some implementations, this can enable a coating that will adhere to the ablation trench (e.g., the material of the intermediate layer) to be applied to the ablation trench and the object surface. The coating, for instance, can be a thin coating that can be applied to the ablation trench and the surrounding surface of the object. The coating can provide various properties to the ablation trench and the surrounding surface, such as color tinting, scratch resistance, fingerprint resistance, and so on.

In at least some implementations, height variations in an object surface caused by an ablation trench can cause variations in light reflection properties such that a graphic applied via the ablation trench appears at a different color tone than a surrounding surface, even if the ablation trench and the surrounding surface are coated with a same coating.

In the following discussion, a section entitled "Example Environment" discusses an example environment that may employ techniques described herein. Embodiments discussed herein are not limited to the example environment, and the example environment is not limited to embodiments discussed herein. Next, a section entitled "Example Implementation Scenarios" discusses some example implementation scenarios in accordance with one or more embodiments. Following this, a section entitled "Example Procedure" describes an example procedure in accordance with one or more embodiments. Finally, an example system and device are discussed that may implement various techniques described herein.

Example Environment

Figure 6:
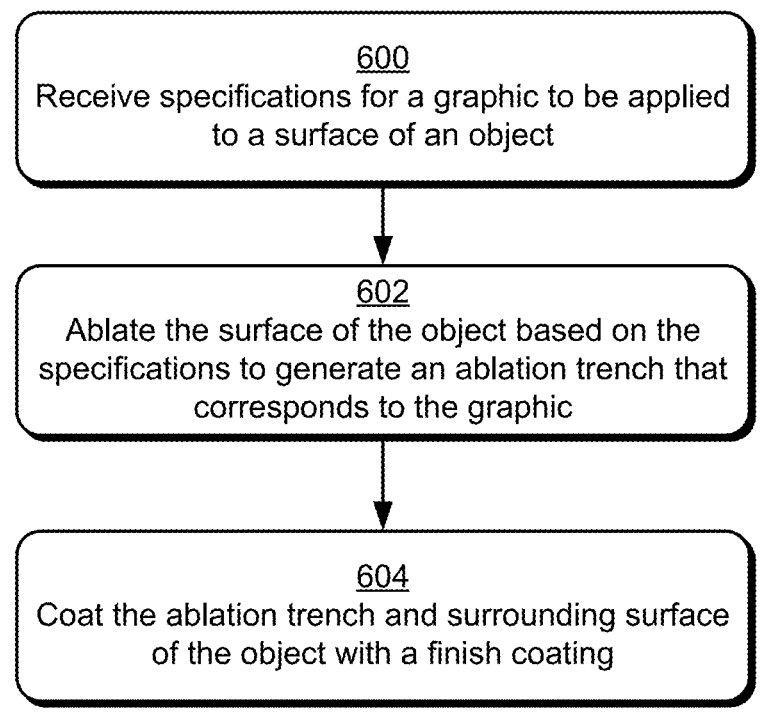
FIG. 6 illustrates a flow diagram that describes steps in a method in accordance with one or more embodiments.

FIG. 1 is an illustration of an environment 100 in an example implementation that is operable to employ the techniques described herein. The environment 100 includes a control device 102, which can be configured as a computing device that is capable of performing various operations. One example implementation of the control device 102 is discussed below with reference to FIG. 6.

The control device 102 includes and/or is operably associated with an ablation device 104, which is configured to remove material from an object surface and/or other layer according to techniques discussed herein. For instance, the ablation device 104 can include a mechanism capable of generating a laser that can be controlled to remove material from an object. A variety of other ablation mechanisms and/or techniques may be employed within the spirit and scope of the claimed embodiments.

The control device 102 further includes and/or is further operably associated with a coating device 106, which is representative of functionality to apply various types of coatings to objects. Examples of suitable coatings which may be applied via the coating device 106 include thin films (e.g., via physical vapor deposition (PVD), chemical vapor deposition (CVD), and so on), anti-fingerprint (AFP) coatings (e.g., lipophobic and/or hydrophobic coatings), nanocoatings, and so on.

An input/output (I/O) module 108 and an ablation control module 110 are further included. The I/O module 108 is configured to receive various types of input, such as input from a user, another device, a data storage medium, and so on. In at least some implementations, input to the I/O module 108 can include specifications for a graphic to be applied to an object. For instance, the specifications can include dimensions for a graphic, such as width, length, ablation depth, and so on. Input to the I/O module 108 may also include coating specifications, such as coating type, color specifications, coating depth, and so on.

The ablation control module 110 represents functionality to control various operations of the ablation device 104. In at least some implementations, the ablation control module 110 can represent a driver that provides an interface to the ablation device 104 from the I/O module 108.

A coating control module 112 is further included, which represents functionality to control operation of the coating device 106. For instance, the coating control module 112 can represent a driver that provides an interface to the coating device 106 from the I/O module 108.

The environment 100 further includes an object 114, which is representative of an instance of various physical objects upon which graphics can be applied according to techniques discussed herein. The object 114, for instance, can be configured as a wide variety of different objects, such as a computing device (e.g., a mobile computing device), a toy, a vehicle, and/or any other object that includes a surface upon which a graphic can be applied.

Further illustrated in the environment 100 is that the object 114 is processed by the control device 102 to produce a marked object 116. The marked object 116 includes a surface 118 upon which a graphic 120 is applied according to techniques discussed herein.

For instance, the I/O module 108 receives input (e.g., user input) that includes specifications for the graphic 120, e.g., ablation coordinates to be applied to the surface 118. The specifications are passed to the ablation control module 110, which controls operation of the ablation device 104 to remove material from the surface 118. Control of the ablation device 104 can include control of various operational attributes, such as laser power (e.g., flux), laser pulse duration and/or frequency, physical movement of the ablation device 104 relative to the surface 118, and so forth.

Removal of the material creates an ablation trench 122 in the surface 118 in the shape of the graphic 120. The ablation trench 122 represents a perforation in a surface plane of the surface 118 caused by the removal of the material. As detailed below, depth of the ablation trench 122 can be specified to attain various visual and/or physical properties for the marked object 116 and/or the graphic 120.

After ablation of the surface 118 to create the graphic 120, the surface 118 may be coated by the coating device 106 with one or more types of coatings. In at least some implementations, application of a coating can tint and/or color the surface 118 and the graphic 120. Application of a coating can also increase surface durability, such as by providing resistance to fingerprinting, scratch resistance, and so on.

Example Implementation Scenarios

This section discusses some example implementations scenarios in accordance with various embodiments.

Figure 2:
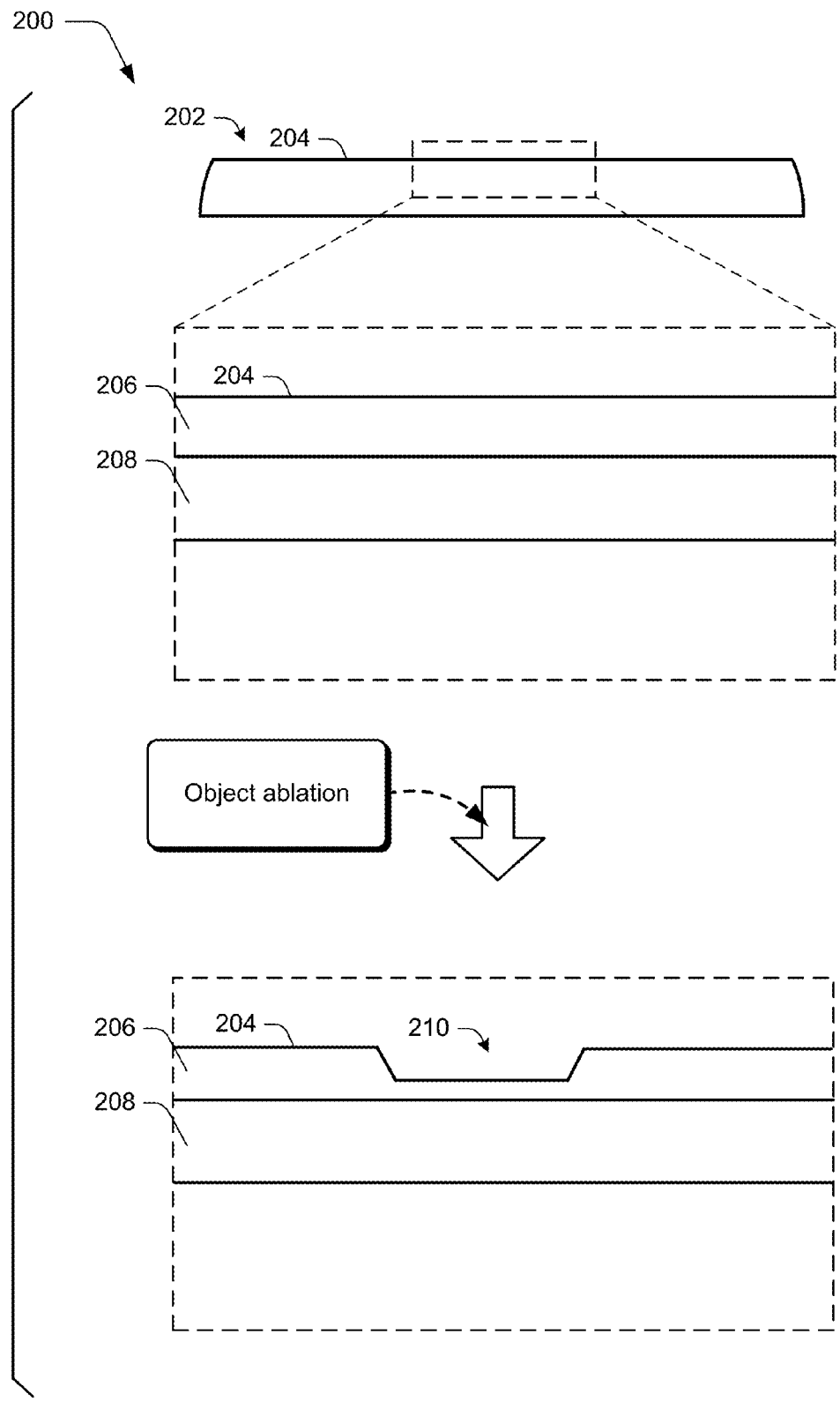
FIG. 2 depicts an example implementation scenario of techniques discussed herein in accordance with one or more embodiments.

FIG. 2 illustrates an example implementation scenario 200 according to techniques described herein. The upper portion of the scenario 200 illustrates a side view of an object 202 with a surface 204. Also illustrated is a partial cutaway view of the object 202, which reveals layering of material beneath the surface 204. In this example, the object 202 includes a surface layer 206, the top portion of which forms the surface 204. Beneath the surface layer 206 is a substrate 208.

In at least some implementations, the substrate 208 can form at least a portion of an internal portion of the object 202, such as a housing for the object. For instance, with reference to a mobile computing device implementation, the substrate 208 can form an internal surface of a chassis for the mobile computing device.

The substrate 208 and the surface layer 206 can be formed from various materials, such as metals, alloys, compounds, resins, and so forth. In this particular example, the substrate 208 is formed from a magnesium alloy. However, substrates formed from other materials may be employed as well, such as different metals and/or metal alloys, resins, plastics, and so on.

Proceeding to the lower portion of the scenario 200, the surface 204 is ablated (e.g., using the ablation device 104) to generate an ablation trench 210. The ablation trench 210 is created by removing material from the surface layer 206 to create a perforation in the surface 204. Although only a cross section of the ablation trench 210 is illustrated, the ablation trench 210 in its entirety corresponds to a pre-specified graphic. For instance, the ablation trench 210 can correspond to a shape for a particular graphic, such as the graphic 120 discussed above with reference to environment 100.

Figure 3:
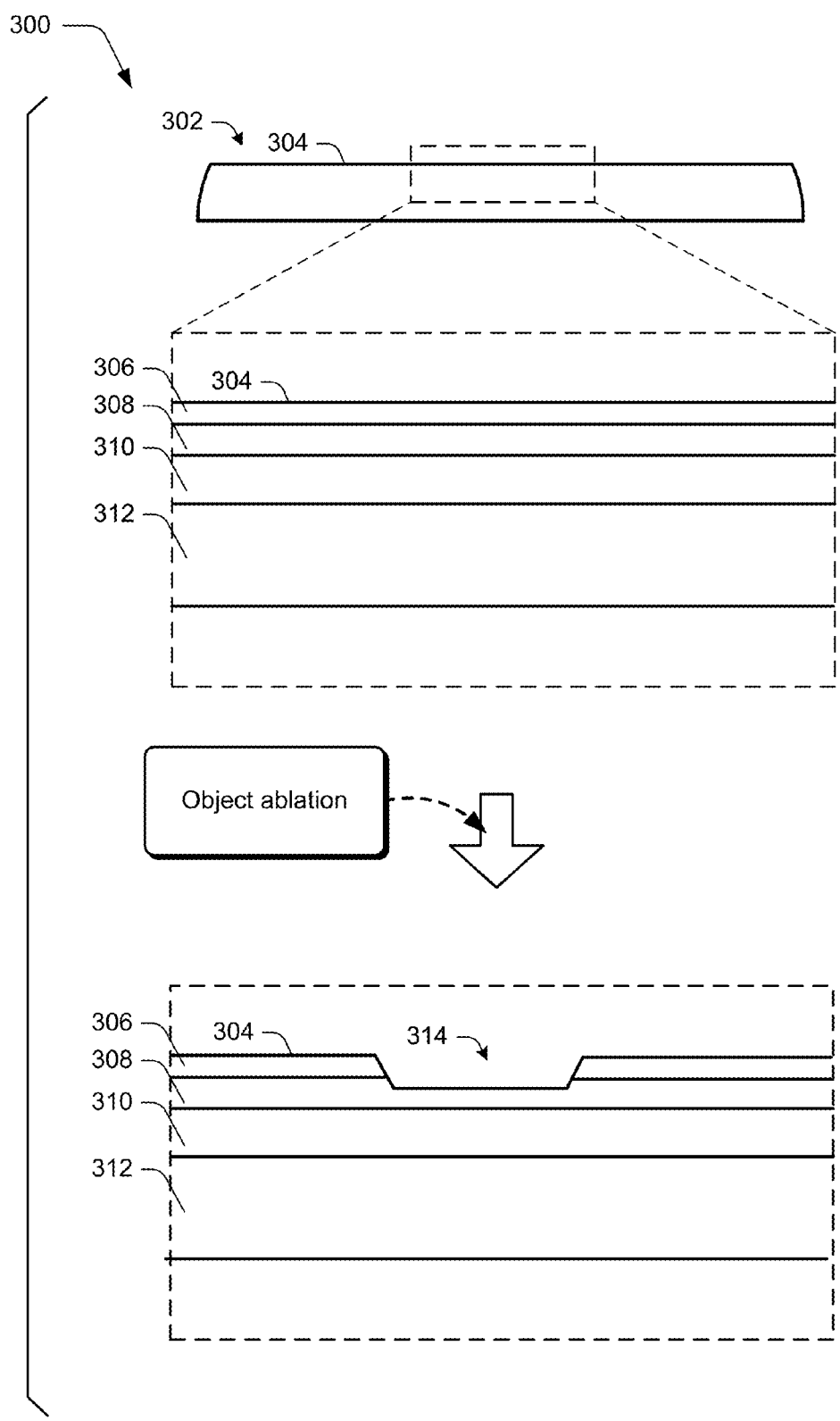
FIG. 3 depicts an example implementation scenario of techniques discussed herein in accordance with one or more embodiments.

FIG. 3 illustrates an example implementation scenario 300 according to techniques described herein. The upper portion of the scenario 300 illustrates a side view of an object 302 with a surface 304. Also illustrated is a partial cutaway view of the object 302, which reveals layering of material beneath the surface 304. In this example, the object 302 includes a surface layer 306, the top portion of which forms the surface 304. Beneath the surface layer 306 are a first sublayer 308 and a second sublayer 310. The second sublayer 310 is placed on a substrate 312. In at least some implementations, the substrate 312 can form at least a portion of an internal portion of the object 302, such as a housing for the object. For instance, with reference to a mobile computing device implementation, the substrate 312 can form an internal surface of a chassis for the mobile computing device.

The substrate 312, the surface layer 306, and the sublayers 308, 310 can be formed from various materials, such as metals, alloys, compounds, resins, and so forth. In this particular example, the substrate 312 is formed from a magnesium alloy. However, substrates formed from other materials may be employed as well, such as different metals and/or metal alloys.

In at least some embodiments, the substrate 312 can be treated to improve adhesion properties for subsequent layers. For instance, the substrate 312 can be treated using a zincate process (e.g., a double zincate process) to deposit zinc on the surface of the substrate 312 prior to application of the second sublayer 310 to the substrate 312. Zinc deposition on the substrate 312 can improve adhesion of the second sublayer 310 to the substrate 312.

Further to the scenario 300, the surface layer 306 and the sublayers 308, 310 are adhered to the substrate 312, such as utilizing various types of deposition and/or plating processes. For instance, in at least one embodiment the second sublayer 310 is formed from copper, such as from one or more forms of elemental copper, copper compounds, and so on. Further, the first sublayer 308 is formed from nickel, such as from one or more forms of elemental nickel, nickel compounds, and so on. The surface layer 306 can be formed from chromium, such as from one or more forms of elemental chromium, chromium compounds, and so on. Thus, in a least some implementations, the surface layer 306, the first sublayer 308, and the second sublayer 310 can be adhered to the substrate 312 to form distinct layers of different materials.

Further to one or more embodiments, the surface layer 306, the first sublayer 308, and the second sublayer 310 can be applied according to various thicknesses and thickness variations. For instance, consider the following example specifications for each of the respective layers.

(1) Second sublayer 310:
  (a) applied to the substrate 312 at 30 micrometers ("µ") thickness, with a tolerance of +15µ and −15µ; or
  (b) applied to the substrate 312 at up to 1500µ thickness.
(2) First sublayer 308:
  (a) applied to the second sublayer 310 at 9µ thickness, with a tolerance of +/−5µ; or
  (b) applied to the second sublayer 310 at up to 45µ thickness.
(3) Surface layer 306:
  (a) applied to the first sublayer 308 at 0.1µ-0.3µ thickness; or
  (b) applied to the first sublayer 308 at up to 1.50µ thickness.

The specifications indicated above are provided for purpose of example only, the different thicknesses may be employed in accordance with the claimed embodiments. Further, the thicknesses of the different layers may be independently varied to obtain different variations of thicknesses between the different layers. In at least some embodiments, a layer or layers may be omitted.

Proceeding to the lower portion of the scenario 300, the surface 304 is ablated (e.g., using the ablation device 104) to generate an ablation trench 314. The ablation trench 314 is created by removing material from the surface layer 306 and one or more of the sublayers to create a perforation in the surface 304. Although only a cross section of the ablation trench 314 is illustrated, the ablation trench 314 in its entirety corresponds to a pre-specified graphic. For instance, the ablation trench 314 can correspond to a shape for a particular graphic, such as the graphic 130 discussed above with reference to environment 100.

In this particular example, the ablation trench 314 passes through the surface layer 306 and into the first sublayer 308, without penetrating an interface between the first sublayer 308 and the second sublayer 310. Thus, the depth of the ablation trench 314 is such that a bottom the ablation trench 314 is within the first sublayer 308, and such that the second sublayer 310 remains covered (e.g., sealed) by the first sublayer 308. In at least some implementations, the ablation trench penetrates the first sublayer 308 at a depth range of 2µ-4µ. However, different penetration depths may be employed according to various embodiments.

Figure 4:
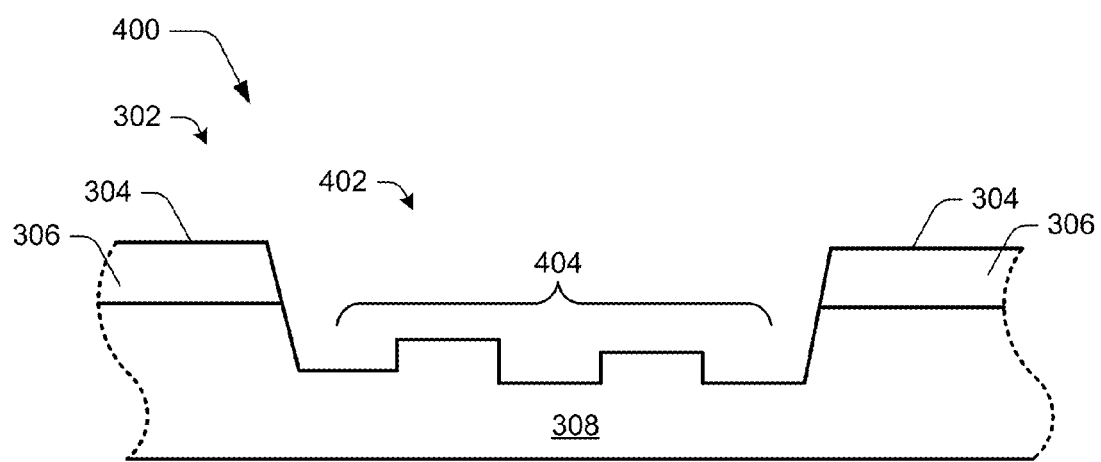
FIG. 4 depicts a magnified sectional view of an object processed according to techniques discussed herein and in accordance with one or more embodiments.

FIG. 4 illustrates a magnified section 400 of the side view of the object 302, discussed above. Included as part of the section 400 are the surface 304, the surface layer 308, and the first sublayer 308. Further illustrated is an ablation trench 402.

In this particular example, the ablation trench 402 includes surface variations 404 that result in varying depth for the ablation trench 402. For instance, the surface variations 404 can cause the penetration depth of the ablation trench 402 into the first sublayer 308 to vary between 1μ-4μ. In implementations where a coating is applied to the ablation trench 402 (as discussed below), the surface variations 404 can cause variations in optical properties of a graphic generated using the ablation trench 402. For instance, the surface variations 404 can increase the number and variation in reflective surfaces such that variations in light reflection and/or scattering occur.

In at least some implementations, the surface variations 404 can be caused by variations in ablation. For instance, the ablation control module 110 can vary the power, distance (e.g., from the surface 304), and/or the angle of the ablation device 104 during an ablation process, thus resulting in the surface variations 404. Variations in power, for instance, can be caused by pulsing the ablation device 104 (e.g., laser pulsing) at different power levels during an ablation process.

Having discussed an example implementation scenario that employs object ablation, consider now an example implementation scenario for object coating.

Figure 5:
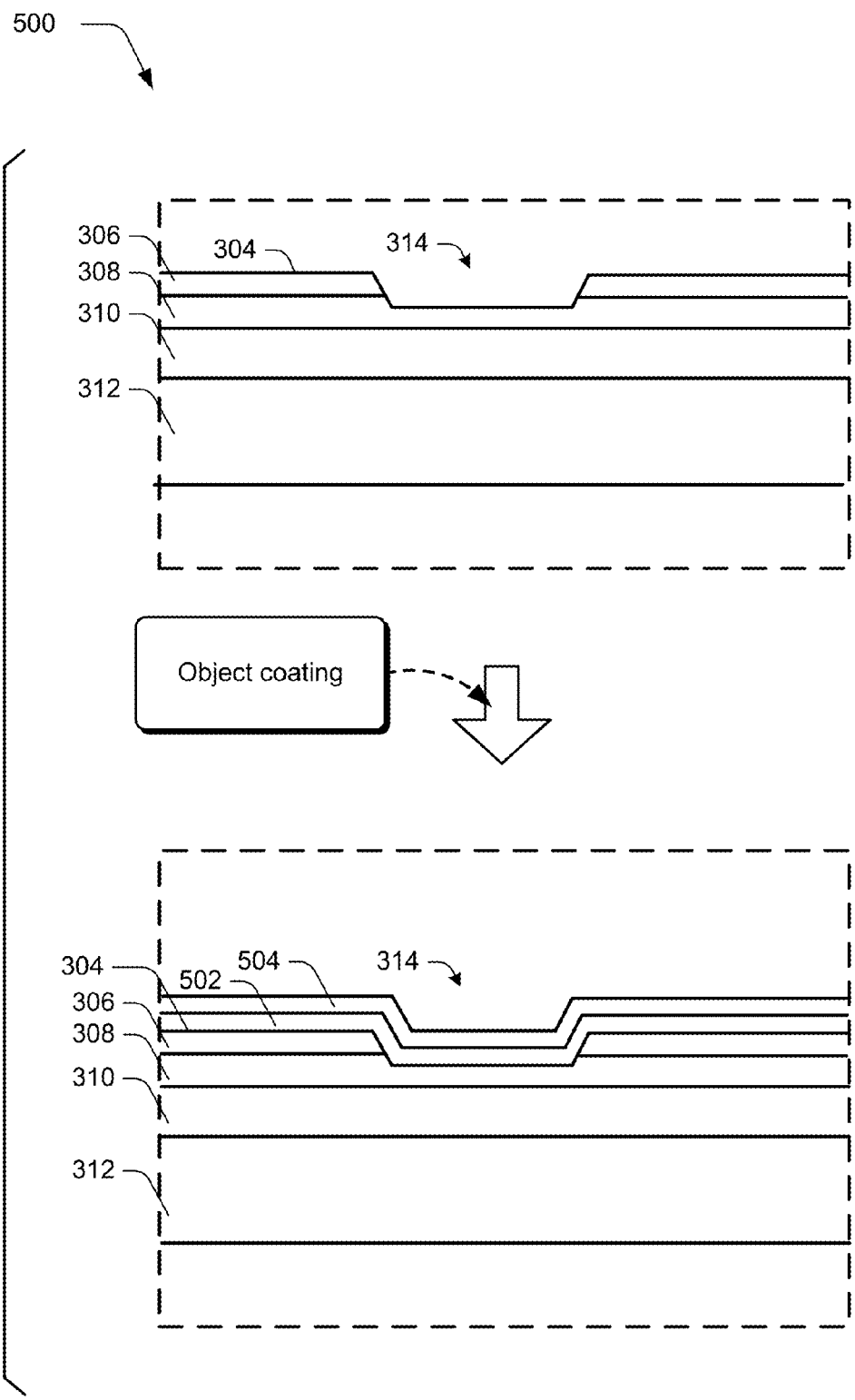
FIG. 5 depicts an example implementation scenario of techniques discussed herein in accordance with one or more embodiments.

FIG. 5 illustrates an example implementation scenario 500 according to techniques described herein. The scenario 500 describes example ways of coating ablated objects, such as discussed above with reference to the scenarios 200-400. In the upper portion of the scenario 500, the partial cutaway view of the object 302 as illustrated in FIG. 3 is presented, including the ablation trench 314 generated via ablation of portions of the object 302.

Proceeding to the lower portion of the scenario 500, several coating layers are applied to the surface 304, such as via the coating device 106 discussed above with reference to environment 100. In this particular example, a first coating layer 502 is applied to the surface 304. In an example implementation, the first coating layer 502 can be a thin film, such as applied via PVD, CVD, and so forth. For instance, the first coating layer 502 can be applied using a chrome carbide PVD to achieve a particular color and/or tint for the first coating layer 502. Other materials may additionally or alternatively be employed for the first coating layer 502, such as titanium carbide, zirconium carbide, and/or other metal carbides, metal nitride coatings, and so forth. The first coating layer 502 can optionally include tinting and/or coloring that can change the optical appearance of the surface 304.

The first coating layer 502 can be applied to the surface 304, including the ablation trench 314, at an approximately consistent thickness. For instance, the first coating layer can be applied at a thickness that ranges from 0.4μ-1.2μ. Thus, the first coating layer 502 can be applied such that the surface 304 and the ablation trench 314 are uniformly colored.

Further to the scenario 500, a second coating layer 504 is applied on top of the first coating layer 502. The second coating layer 504 can be a protective material, such as an AFP coating, a scratch-resistance coating, a nano-coating, and so forth. For instance, the second coating layer 504 can be applied as a protectant for the first coating layer 502 and/or other layers, such as to prevent fingerprint adhesion, resist surface scratching, and so forth.

According to one or more embodiments, the second coating layer 504 can be applied to the first coating layer 502 at an approximately uniform thickness. For instance, the thickness of the second coating layer 504 can range from 0.25μ-1.50μ.

In at least some implementations, color measurement of the surface 304 and the ablation trench 314 when coated with the first coating layer 502 and the second coating layer 504 (e.g., using a suitable color meter) can indicate that the surface 304 and the ablation trench 314 are the same color. Differences in surface height between the surface 304 and the ablation trench 314, however, can result in differences in light reflection properties. For instance, specular and/or other reflection properties in response to incident light on the surface 304 and the ablation trench 314 can differ, causing visual color tonal differences between the surfaces. This can cause visually perceptible color differences between a graphic applied via the ablation trench 314 and a surrounding surface (e.g., the surface 304), even though the ablation trench 314 and the surrounding surface are coated with the same color.

Surface variations in the ablation trench 314 (e.g., as discussed above), may also contribute to differences in color perception between the surface 304 and the ablation trench 314. As referenced above, such surface variations can cause variable light reflection and/or scattering properties in the ablation trench 314. Such variable light properties can result in a visual perception of variation in color between the surface 304 and the ablation trench 314, even though both may be coated with a uniformly colored coating.

The example thicknesses and tolerances discussed above are presented for purpose of example only, and a wide variety of different layer thicknesses and tolerances can be employed within the spirit and scope of the claimed embodiments.

Example Procedure

The following discussion describes an example procedure in accordance with one or more embodiments. In portions of the following discussion, reference will be made to the environment 100 and the implementation scenarios discussed above.

FIG. 5 is a flow diagram that describes steps in a method in accordance with one or more embodiments. Step 600 receives specifications for a graphic to be applied to a surface of an object. For example, the I/O module 108 can receive input that includes various specifications for a graphic, such as a pattern for a graphic in terms of x and y coordinates. The specifications may also include an ablation depth and/or variations in ablation depth to be used to apply the graphic to the surface.

Step 602 ablates the surface of the object based on the specifications to generate an ablation trench that corresponds to the graphic. For instance, the specifications can be provided from the I/O module 108 to the ablation control module 110, which controls operation of the ablation device 104 to ablate the surface according to the specifications.

As discussed above, the object can include multiple layers of material layered on top of a substrate. Further, the ablation trench can penetrate a surface layer in the shape of the specified graphic. The trench depth can be specified such that a lowermost portion of the trench penetrates an intermediate layer without penetrating one or more lower layers.

Step 604 coats the ablation trench and surrounding surface of the object with a finish coating. For instance, specifications for one or more coatings to be applied can be provided to the I/O module 108, which can provide the coating specifications to the coating control module 112. The coating control module 112 can control operation of the coating device 106 to apply a coating to the ablation trench and surrounding surfaces. Examples of finish coatings are discussed above, such as PVDs, AFPs, and so forth. As also discussed above, a finish coating can be tinted such that coloring is applied to the surface of the object and the ablation trench.

Example System and Device

Figure 7:
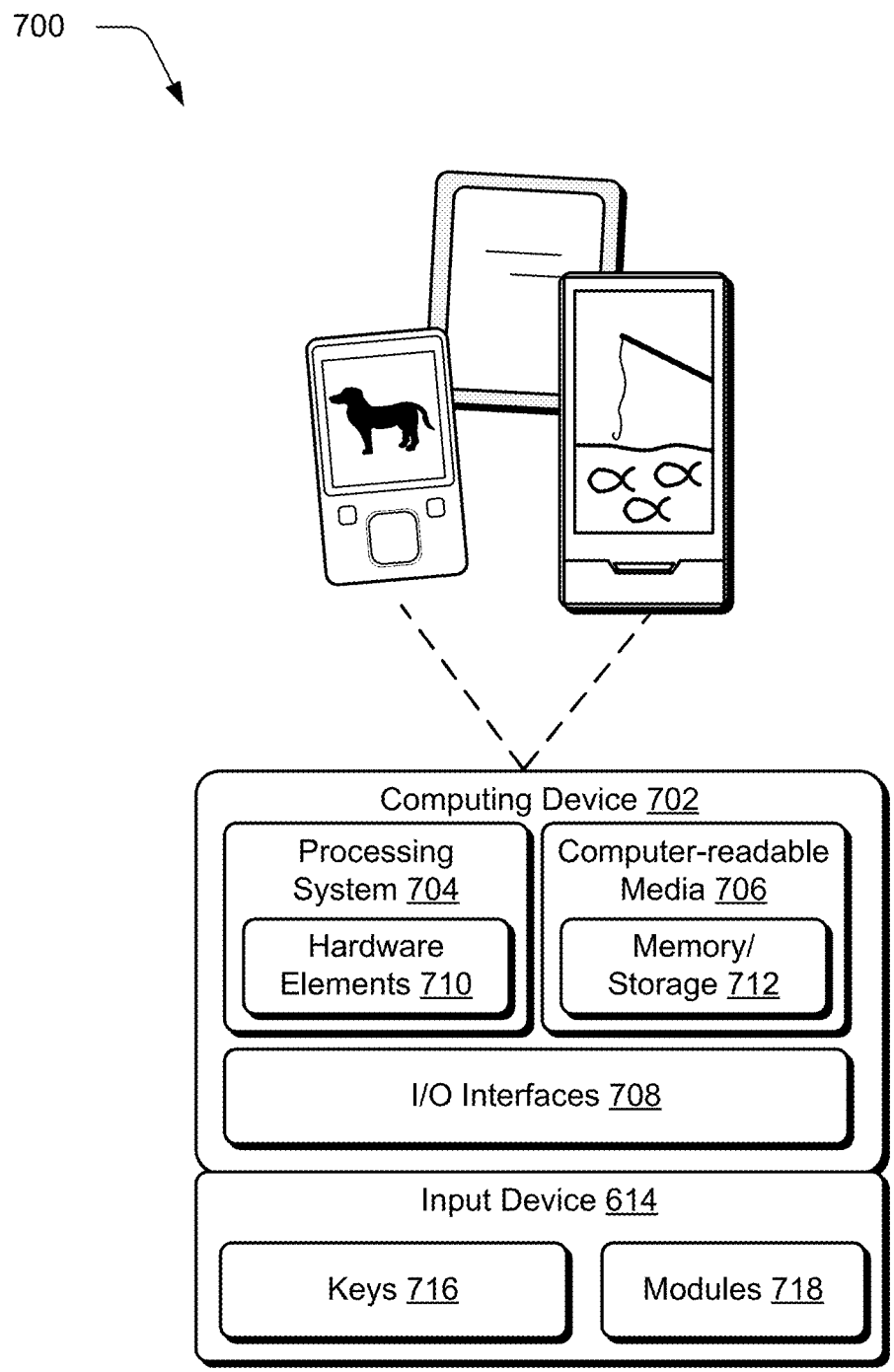
FIG. 7 illustrates an example system including various components of an example device that can be implemented as any type of computing device as described with reference to FIG. 1 to implement embodiments of the techniques described herein.

FIG. 7 illustrates an example system generally at 700 that includes an example computing device 702 that is representative of one or more computing systems and/or devices that may implement the various techniques described herein. The computing device 702 may be, for example, be configured to assume a mobile configuration through use of a housing formed and size to be grasped and carried by one or more hands of a user, illustrated examples of which include a mobile phone, mobile game and music device, and tablet computer although other examples are also contemplated.

The example computing device 702 as illustrated includes a processing system 704, one or more computer-readable media 706, and one or more I/O interface 708 that are communicatively coupled, one to another. Although not shown, the computing device 702 may further include a system bus or other data and command transfer system that couples the various components, one to another. A system bus can include any one or combination of different bus structures, such as a memory bus or memory controller, a peripheral bus, a universal serial bus, and/or a processor or local bus that utilizes any of a variety of bus architectures. A variety of other examples are also contemplated, such as control and data lines.

The processing system 704 is representative of functionality to perform one or more operations using hardware. Accordingly, the processing system 704 is illustrated as including hardware element 710 that may be configured as processors, functional blocks, and so forth. This may include implementation in hardware as an application specific integrated circuit or other logic device formed using one or more semiconductors. The hardware elements 710 are not limited by the materials from which they are formed or the processing mechanisms employed therein. For example, processors may be comprised of semiconductor(s) and/or transistors (e.g., electronic integrated circuits (ICs)). In such a context, processor-executable instructions may be electronically-executable instructions.

The computer-readable media 706 is illustrated as including memory/storage 712. The memory/storage 712 represents memory/storage capacity associated with one or more computer-readable media. The memory/storage component 712 may include volatile media (such as random access memory (RAM) and/or nonvolatile media (such as read only memory (ROM), Flash memory, optical disks, magnetic disks, and so forth). The memory/storage component 712 may include fixed media (e.g., RAM, ROM, a fixed hard drive, and so on) as well as removable media (e.g., Flash memory, a removable hard drive, an optical disc, and so forth). The computer-readable media 706 may be configured in a variety of other ways as further described below.

Input/output interface(s) 708 are representative of functionality to allow a user to enter commands and information to computing device 702, and also allow information to be presented to the user and/or other components or devices using various input/output devices. Examples of input devices include a keyboard, a cursor control device (e.g., a mouse), a microphone (e.g., for voice input), a scanner, touch functionality (e.g., capacitive or other sensors that are configured to detect physical touch), a camera (e.g., which may employ visible or non-visible wavelengths such as infrared frequencies to recognize movement as gestures that do not involve touch), and so forth. Examples of output devices include a display device (e.g., a monitor or projector), speakers, a printer, a network card, tactile-response device, and so forth. Thus, the computing device 702 may be configured in a variety of ways to support user interaction.

The computing device 702 is further illustrated as being communicatively and physically coupled to an input device 714 that is physically and communicatively removable from the computing device 702. In this way, a variety of different input devices may be coupled to the computing device 702 having a wide variety of configurations to support a wide variety of functionality. In this example, the input device 714 includes one or more keys 716, which may be configured as pressure sensitive keys, mechanically switched keys, and so forth.

The input device 714 is further illustrated as include one or more modules 718 that may be configured to support a variety of functionality. The one or more modules 718, for instance, may be configured to process analog and/or digital signals received from the keys 716 to determine whether a keystroke was intended, determine whether an input is indicative of resting pressure, support authentication of the input device 714 for operation with the computing device 702, and so on.

Various techniques may be described herein in the general context of software, hardware elements, or program modules. Generally, such modules include routines, programs, objects, elements, components, data structures, and so forth that perform particular tasks or implement particular abstract data types. The terms "module," "functionality," and "component" as used herein generally represent software, firmware, hardware, or a combination thereof. The features of the techniques described herein are platform-independent, meaning that the techniques may be implemented on a variety of commercial computing platforms having a variety of processors.

An implementation of the described modules and techniques may be stored on or transmitted across some form of computer-readable media. The computer-readable media may include a variety of media that may be accessed by the computing device 702. By way of example, and not limitation, computer-readable media may include "computer-readable storage media" and "computer-readable signal media."

"Computer-readable storage media" may refer to media and/or devices that enable persistent storage of information in contrast to mere signal transmission, carrier waves, or signals per se. Thus, computer-readable storage media excludes signals per se. The computer-readable storage media includes hardware such as volatile and non-volatile, removable and non-removable media and/or storage devices implemented in a method or technology suitable for storage of information such as computer readable instructions, data structures, program modules, logic elements/circuits, or other data. Examples of computer-readable storage media may include, but are not limited to, RAM, ROM, EEPROM, flash memory or other memory technology, CD-ROM, digital versatile disks (DVD) or other optical storage, hard disks, magnetic cassettes, magnetic tape, magnetic disk storage or other magnetic storage devices, or other storage device, tangible media, or article of manufacture suitable to store the desired information and which may be accessed by a computer.

"Computer-readable signal media" may refer to a signal-bearing medium that is configured to transmit instructions to the hardware of the computing device 702, such as via a network. Signal media typically may embody computer readable instructions, data structures, program modules, or other data in a modulated data signal, such as carrier waves, data signals, or other transport mechanism. Signal media also include any information delivery media. The term "modulated data signal" means a signal that has one or more of its characteristics set or changed in such a manner as to encode information in the signal. By way of example, and not limitation, communication media include wired media such as a wired network or direct-wired connection, and wireless media such as acoustic, RF, infrared, and other wireless media.

As previously described, hardware elements 710 and computer-readable media 706 are representative of modules, programmable device logic and/or fixed device logic implemented in a hardware form that may be employed in some embodiments to implement at least some aspects of the techniques described herein, such as to perform one or more instructions. Hardware may include components of an integrated circuit or on-chip system, an application-specific integrated circuit (ASIC), a field-programmable gate array (FPGA), a complex programmable logic device (CPLD), and other implementations in silicon or other hardware. In this context, hardware may operate as a processing device that performs program tasks defined by instructions and/or logic embodied by the hardware as well as a hardware utilized to store instructions for execution, e.g., the computer-readable storage media described previously.

Combinations of the foregoing may also be employed to implement various techniques described herein. Accordingly, software, hardware, or executable modules may be implemented as one or more instructions and/or logic embodied on some form of computer-readable storage media and/or by one or more hardware elements 710. The computing device 702 may be configured to implement particular instructions and/or functions corresponding to the software and/or hardware modules. Accordingly, implementation of a module that is executable by the computing device 702 as software may be achieved at least partially in hardware, e.g., through use of computer-readable storage media and/or hardware elements 710 of the processing system 704. The instructions and/or functions may be executable/operable by one or more articles of manufacture (for example, one or more computing devices 702 and/or processing systems 704) to implement techniques, modules, and examples described herein.

Discussed herein are a number of methods that may be implemented to perform techniques discussed herein. Aspects of the methods may be implemented in hardware, firmware, or software, or a combination thereof. The methods are shown as a set of blocks that specify operations performed by one or more devices and are not necessarily limited to the orders shown for performing the operations by the respective blocks. Further, an operation shown with respect to a particular method may be combined and/or interchanged with an operation of a different method in accordance with one or more implementations. Aspects of the methods can be implemented via interaction between various entities discussed above with reference to the environment 100 and/or the example implementation scenarios discussed above.

CONCLUSION

Although the example implementations have been described in language specific to structural features and/or methodological acts, it is to be understood that the implementations defined in the appended claims is not necessarily limited to the specific features or acts described. Rather, the specific features and acts are disclosed as example forms of implementing the claimed features.

What is claimed is:

1. An apparatus comprising:
a housing formed from a substrate;
a surface layer of at least one of a metal or a metal alloy applied on top of the substrate;
an ablation trench in the shape of a graphic and formed into the surface layer without penetrating into the substrate, the ablation trench including surface variations formed by varying a depth of the ablation trench into the surface layer, the surface variations causing different portions of the graphic to exhibit different optical properties based on the depth; and
at least one coating applied at a uniform thickness over the ablation trench and at least a portion of the surface layer, the uniform thickness causing the surface variations in the ablation trench to be maintained after application of the coating.

2. An apparatus as described in claim 1, wherein the apparatus comprises a computing device, the surface layer comprises an exterior surface of the computing device, and the graphic comprises a visual image to be applied to the exterior surface.

3. An apparatus as described in claim 1, wherein the surface layer is formed from at least one of chromium, a chromium alloy, nickel, or a nickel alloy.

4. An apparatus as described in claim 1, wherein the surface layer is formed at a thickness of up to 1500μ.

5. An apparatus as described in claim 1, wherein the ablation trench is formed such that the ablation trench penetrates the surface layer at a depth range of up to 4μ.

6. An apparatus as described in claim 1, wherein the at least one coating is colored such that a same color is applied to the ablation trench and the at least a portion of the surface layer.

7. An apparatus as described in claim 1, wherein the at least one coating includes at least one of a physical vapor deposition (PVD) coating, a chemical vapor deposition (CVD) coating, or an anti-fingerprint (AFP) coating.

8. An apparatus as described in claim 1, wherein the at least one coating includes a physical vapor deposition (PVD) coating applied to the ablation trench and the at least a portion of the surface layer, and an anti-fingerprint (AFP) coating applied to the PVD coating.

9. An apparatus as described in claim 1, wherein the ablation trench is formed such that incident light on the ablation trench and the at least a portion of the surface layer causes variations in light reflection properties between the ablation trench and the at least a portion of the surface layer.

10. A housing comprising:
a substrate;
multiple layers of materials applied on top of the substrate, at least two of the multiple layers being formed from different metals or different metal alloys;
an ablation trench in the shape of a graphic and formed through an outermost layer of the multiple layers into an intermediate layer of the multiple layers, the ablation trench being formed such that a lowermost portion of the trench is positioned within the intermediate layer without penetrating an interface between the intermediate layer and a lower layer of the multiple layers, the ablation trench including at least one variation in depth formed by varying the depth of the ablation trench, the at least one variation causing a portion of the graphic corresponding to the at least one variation to exhibit different optical properties than at least one other portion of the graphic based on the depth; and at least one colored coating applied at a uniform thickness over the ablation trench and at least a portion of the outermost layer, the uniform thickness causing the at least one variation in depth to be maintained after application of the coating.

11. A housing as described in claim 10, wherein the housing comprises a portion of a computing device, the outermost layer comprises an exterior surface of the computing device, and the graphic comprises an image to be applied to the exterior surface.

12. A housing as described in claim 10, wherein the outermost layer is formed from at least one of chromium or a chromium alloy, the intermediate layer is formed from at least one of nickel or a nickel alloy, and the lower layer is formed from at least one of copper or a copper alloy.

13. A housing as described in claim 12, wherein the outermost layer is formed at a thickness of $0.1\mu$ to $0.3\mu$, the intermediate layer is formed at a thickness of $9.0\mu +/-5\mu$, and the lower layer is formed at a thickness of $20\mu+/-5\mu$.

14. A housing as described in claim 13, wherein the ablation trench is formed such that the ablation trench penetrates the intermediate layer at a depth range of $2\mu$ to $4\mu$.

15. A housing as described in claim 10, wherein the at least one colored coating comprises a physical vapor deposition (PVD) coating applied to the ablation trench and the at least a portion of the outermost layer, the at least one colored coating applied at a thickness that ranges from $0.4\mu$ to $1.2\mu$.

16. A housing comprising:
a substrate;
a surface layer of at least one of a metal or a metal alloy applied on top of the substrate;
an ablation trench in the shape of a graphic and formed into the surface layer without penetrating into the substrate, the ablation trench formed according to a specification that defines a depth of the ablation trench for a respective portion of the graphic, the specification defining at least two different depths of the ablation trench for at least two different portions of the graphic, the at least two different depths causing the at least two different portions of the graphic to have different optical properties; and a coating applied at a uniform thickness over the ablation trench and at least some portion of the surface layer such that the different optical properties of the at least two different portions are exhibited after application of the coating.

17. A housing as described in claim 16, wherein the specification comprises a pattern for the graphic and the ablation depth is defined in the form of a depth range for the ablation trench.

18. A housing as described in claim 16, wherein the ablation trench is formed using a laser.

19. A housing as described in claim 16, wherein the coating is colored such that a same color is applied to the ablation trench and the at least some portion of the surface layer.

20. A housing as described in claim 16, wherein the specification defines at least three different depths of the ablation trench for at least three different portions of the graphic.

* * * * *